United States Patent
Nahir et al.

(10) Patent No.: US 7,530,036 B2
(45) Date of Patent: May 5, 2009

(54) RANDOM TEST GENERATION USING AN OPTIMIZATION SOLVER

(75) Inventors: Amir Nahir, Haifa (IL); Yossi Shiloach, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/672,527

(22) Filed: Feb. 8, 2007

(65) Prior Publication Data

US 2008/0195982 A1 Aug. 14, 2008

(51) Int. Cl.
G06F 17/50 (2006.01)
(52) U.S. Cl. .............................................. 716/5; 716/4
(58) Field of Classification Search ................... 716/4–6
See application file for complete search history.

(56) References Cited

U.S. PATENT DOCUMENTS

| | | | | |
|---|---|---|---|---|
| 6,470,482 | B1* | 10/2002 | Rostoker et al. ................ | 716/6 |
| 6,629,293 | B2* | 9/2003 | Chang et al. .................... | 716/4 |
| 6,678,871 | B2* | 1/2004 | Takeyama et al. .............. | 716/6 |
| 6,799,309 | B2* | 9/2004 | Dhanwada et al. ............. | 716/8 |

OTHER PUBLICATIONS

Adir et al., "Genesys-Pro: Innovation in Test Program Generation for Functional Processor Verification," IEEE Design & Test of Computers, (21:2), Mar.-Apr. 2004, pp. 84-92.
Bin et al., "Using Constraint Satisfaction Formulation and Solution Techniques for Random Test Program Generation," IBM Systems Journal, (41:3), Aug. 2002, pp. 386-402.
ILOG, Inc. (Mountain View, California) www.ilog.com/products/cplex.
A. Nahir et al. "Using Linear Programming Techniques for Scheduling-based Random Test-case Generation", IBM Haifa Verification Conference, Oct. 2006.
Edward P.K. Tsang et al, "A family of stochastic methods for constraint satisfaction and optimization", The First International Conference on The Practical Application of Constraint Technologies and Logic Programming (PACLP), London, Apr. 1999, 359-383.
M. Schoenauer et al., "Constrained GA optimization", Proceedings of the Fifth International Conference on Genetic Algorithms, 1993, p. 573-80.
A. Hernandez Aguirre et al, "IS-PAES: a constraint-handling technique based on multiobjective optimization concepts", Evolutionary Multi-Criterion Optimization. Second International Conference, EMO 2003. Proceedings (Lecture Notes in Computer Science vol. 2632), 2003, p. 73-87.
Wang Yong et al., "A constrained optimization evolutionary algorithm based on multiobjective optimization techniques", The 2005 IEEE Congress on Evolutionary Computation (IEEE Cat. No. 05TH8834), 2005, pt. 2, p. 1081-7 vol. 2.
P.D. Surry et al. "The COMOGA method: constrained optimisation by multi-objective genetic algorithms", Control and Cybernetics, v 26, n 3, 1997, p. 391-412.

* cited by examiner

Primary Examiner—Stacy A Whitmore
Assistant Examiner—Binh C Tat

(57) ABSTRACT

An optimization process is repeatedly invoked over an input, which includes the set of constraints and the objective function. The input of each invocation is randomly modified, so as to cause the optimization process to produce multiple different solutions that satisfy the set of constraints. Multiple random test cases for verifying a compliance of the design with the specifications are generated, based on the multiple different solutions produced by the optimization process.

16 Claims, 3 Drawing Sheets

RANDOM TEST GENERATION USING AN OPTIMIZATION SOLVER

FIELD OF THE INVENTION

The present invention relates generally to design verification and testing, and particularly to methods and systems for random test generation.

BACKGROUND OF THE INVENTION

Functional hardware verification is often carried out by subjecting the verified design to multiple random test cases, which comply with a given specification. Random test case generation is sometimes formulated as a constraint satisfaction problem (CSP). Generally, when expressing a problem as a CSP, the problem is specified in terms of a set of variables, each of which can assume values in a given domain, and a set of constraints that the variables should simultaneously satisfy. Each constraint may be expressed as a relation, defined over some subset of the variables, denoting valid combinations of their values. A solution to the problem is an assignment of a value to each variable from its domain that satisfies all of the constraints.

An exemplary test generator, which uses CSP solving techniques for generating random test cases is described by Adir et al., in "Genesys-Pro: Innovation in Test Program Generation for Functional Processor Verification," IEEE Design & Test of Computers, (21:2), March-April, 2004, pages 84-92. CSP-based random test generation methods are also described by Bin et al., in "Using Constraint Satisfaction Formulation and Solution Techniques for Random Test Program Generation," IBM Systems Journal, (41:3), August, 2002, pages 386-402. The paper shows methods for modeling random test program generation as a CSP, and describes a set of solution techniques that are used in practical test-case generation tools.

Optimization methods are used in a variety of applications for determining the optimal solution of a mathematical problem. Applications of optimization methods include, for example, worker shift planning, flow problems, packaging problems, time-table optimization, resource allocation, financial optimization problems and many others. In a typical optimization task, the problem is expressed using a set of constraints defined over variables, and an objective function defined over at least some of the variables. The optimization process seeks a solution that satisfies the constraints, while maximizing or minimizing the objective function.

Several optimization methods and tools are known in the art. For example, ILOG, Inc. (Mountain View, Calif.), offers an optimization tool called CPLEX, for solving linear, mixed-integer and quadratic programming problems. Details regarding this product are available at www.ilog.com/products/cplex. As another example, Dash Optimization, Inc. (Englewood Cliffs, N.J.), offers a modeling and optimization suite called Xpress-MP. Details regarding this product can be found at www.dashoptimization.com.

SUMMARY OF THE INVENTION

There is therefore provided, in accordance with an embodiment of the present invention, a computer-implemented method for verifying a design. The method includes converting test specifications of the design into a set of constraints defined over variables, such that solutions that satisfy the set of constraints define respective valid test cases for verifying the design. An objective function is defined over at least some of the variables.

An optimization process is repeatedly invoked over an input, which includes the set of constraints and the objective function. The input of each invocation is randomly modified, so as to cause the optimization process to produce multiple different solutions that satisfy the set of constraints. Multiple random test cases for verifying a compliance of the design with the specifications are generated, based on the multiple different solutions produced by the optimization process.

The present invention will be more fully understood from the following detailed description of the embodiments thereof, taken together with the drawings in which:

DETAILED DESCRIPTION OF EMBODIMENTS

Overview

Random test case generation is often performed by formulating the specification of the verified design and the test requirements as a set of constraints, and determining solutions that satisfy the constraints out of the solution space, i.e., the space of possible solutions.

The set of constraints may be solved using a known optimization process. In some cases, optimization processes are considerably more efficient than CSP-based methods in solving constraint problems. Optimization processes, however, usually produce only a single optimal solution to the input constraint problem. Moreover, optimization processes are typically deterministic. In other words, given the same input, an optimization process will repeatedly converge to the same solution. In verification and testing applications, on the other hand, it is usually desired to generate multiple different solutions, which are preferably distributed randomly throughout the solution space, in order to provide good testing coverage.

The embodiments of the present invention that are described hereinbelow provide methods and systems for random test case generation using optimization solving methods. The methods and systems described herein modify the set of constraints and/or the objective function provided to an optimization solver in a random manner, thus causing the optimization solver to produce multiple different solutions to a given constraint problem. Similar methods and systems may be used, mutatis mutandis, in other applications of constraint satisfaction and optimization.

Several alternative methods for modifying the constraints and/or objective function are described hereinbelow. Some of these methods produce solutions that are located on the outer boundary of the solution space. Other methods produce solutions that are located on the boundary of a subspace of the solution space, but not on the boundary of the solution space itself. Using these methods, solutions located in the interior of the solution space can also be reached.

Since optimization methods are often highly efficient in solving constraint problems, the methods and systems described herein increase the computational efficiency of random test case generators. This increase in computational efficiency can be used to reduce the time and cost of the verification process, or to improve the verification quality by increasing the number and complexity of the test cases.

System Description

Figure 1:
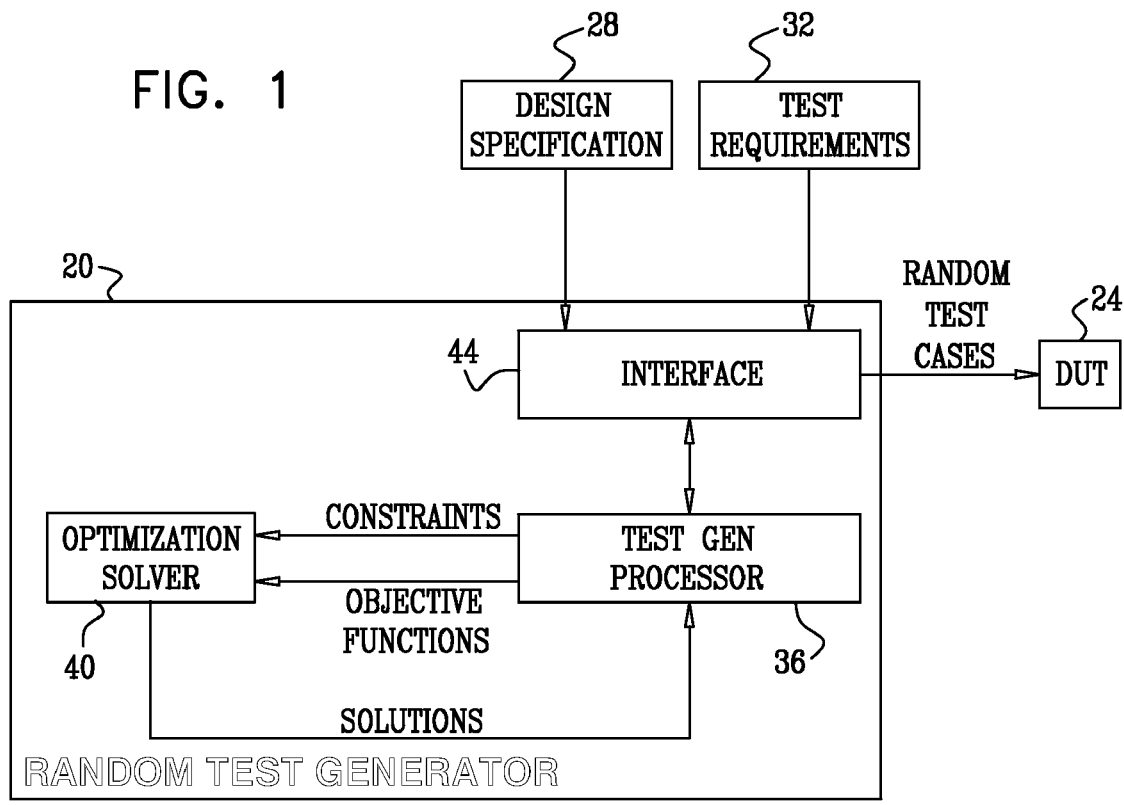
FIG. 1 is a block diagram that schematically illustrates a random test generator, in accordance with an embodiment of the present invention.

FIG. 1 is a block diagram that schematically illustrates a random test generator 20, in accordance with an embodiment of the present invention. Test generator 20 produces random test cases for testing a Design Under Test (DUT) 24. DUT 24 typically comprises a hardware design of a device or a system. For example, when verifying the design of a microprocessor, each test case comprises a test program that runs on the verified microprocessor design.

Test generator 20 accepts a design specification 28 and a set of test requirements 32 as input. Specification 28 defines the architecture and functionality of the verified design, typically expressed as logical rules or formulas. Test requirements 32 define directives, preferences and/or requirements regarding the generation of test cases. For example, the test requirements may define the number and complexity of the test cases, and/or focus the tests on a certain part of the design or on events that are expected to reveal design faults. The design specification and test requirements can be viewed collectively as a test specification, which defines the tests to be generated by generator 20.

Generator 20 comprises a test generation processor 36, which accepts the test specification and generates multiple random test cases that meet the specification. Processor 36 translates the test specification into a set of constraints, which is defined over variables. Each variable can take its value from a predefined domain. The constraints may comprise linear constraints, non-linear constraints, integrality constraints or any other suitable constraint type. Automatic conversion of a test specification into a set of constraints may be carried out using any suitable method known in the art. Exemplary methods are described in U.S. Patent Application Publication 2005/0278702 and in U.S. Pat. No. 7,058,926, whose disclosures are incorporated herein by reference.

The processor also defines an objective function over at least some of the variables. The objective function typically maps each assignment of its variables to a real number, which indicates an optimality measure of the variable value assignment.

Generator 20 further comprises an optimization solver 40, which is invoked by processor 36. When invoked, solver 40 accepts the set of constraints and the objective function from processor 36, and returns a single solution it considers to be optimal, assuming such a solution exists. The optimal solution is a value assignment of the variables, which satisfies the set of constraints and optimizes (i.e., maximizes or minimizes) the objective function.

In order to generate multiple different solutions, processor 36 modifies the constraints and/or the objective function in a random manner, using methods that are explained in detail hereinbelow. As a result of the random modifications, solver 40 produces, with high probability, a different random solution at each iteration. Processor 36 creates and outputs random test cases based on the solutions produced by solver 40.

Test generator 20 accepts the specification and outputs the generated test cases using an interface 44. Interface 44 may comprise a file interface, a network connection, a direct connection to a test setup or to another computerized system or user terminal, or any other suitable interface type.

DUT 24 is subjected to the generated random test cases, in order to verify that the design complies with its specification and to locate design faults and other non-compliance events. In some embodiments, DUT 24 comprises a Hardware Description Language (HDL) simulation of the verified design, such as a Very high speed integrated circuit Hardware Description Language (VHDL) or Verilog® simulation. Alternatively, the test cases may be applied to other simulation types, to a software, hardware or firmware implementation of the design, or to a combination of such implementations.

Solver 40 may use any suitable optimization process known in the art. For example, the solver may use gradient-based methods such as Least Mean Squares (LMS) or Recursive Least Squares (RLS) methods, methods based on exhaustive search of the solution space, methods based on Genetic Algorithms (GA), methods based on the Simplex algorithm and/or any other suitable optimization process known in the art. In some embodiments, solver 40 comprises a known product, such as the CPLEX or Xpress-MP optimization solvers, cited above. The CPLEX solver, for example, uses a Simplex-based optimization process.

Typically, processor 36 and solver 40 comprise general-purpose computers, which are programmed in software to carry out the functions described herein. The software may be downloaded to the computers in electronic form, over a network, for example, or it may alternatively be supplied to the computers on tangible media, such as CD-ROM. Processor 36 and solver 40 may be implemented in a single computing platform or using separate computing platforms.

Generating Random Solutions Using an Optimization Solver

Figure 2:
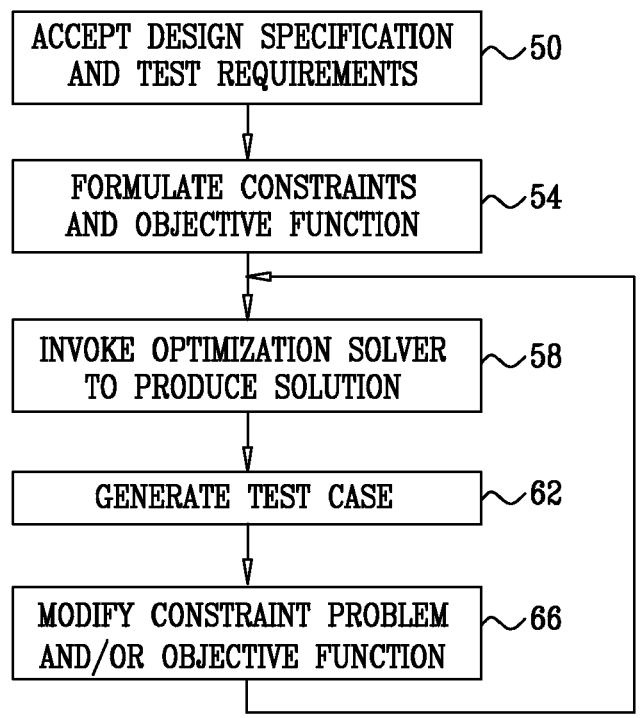
FIG. 2 is a flow chart that schematically illustrates a method for random test generation using an optimization solver, in accordance with an embodiment of the present invention.

FIG. 2 is a flow chart that schematically illustrates a method for random test generation using an optimization solver, in accordance with an embodiment of the present invention. The method begins with a user, such as a verification engineer or designer, providing a test specification to test generator 20, at an input step 50. The test specification may comprise design specification 28 and/or test requirements 32.

Processor 36 converts the test specification to a constraint problem, i.e., to a set of constraints and an objective function, at a problem formulation step 54. Processor 36 invokes optimization solver 40 to produce an optimal solution to the constraint problem, at an optimization step 58. Processor 36 provides the constraints and objective function to solver 40, and typically instructs the solver whether the sought optimal solution should minimize or maximize the objective function.

Generally, the set of constraints has multiple solutions, i.e., multiple value assignments of the variables that satisfy the constraints. The collection of all valid solutions of a certain set of constraints is referred to as the solution space. When N variables are defined, the solution space can be represented graphically as occupying a volume in the N-dimensional space spanned by the variables. The optimization solver returns a solution within the solution space, which minimizes or maximizes the objective function.

In some embodiments, processor 36 selects at random whether to instruct the solver to minimize or maximize the objective function. Although uncommon in most test generation applications, in some cases the objective function is not bounded within the solution space in question. When the objective function is not minimally-bounded, processor 36 typically instructs the solver to maximize the objective function. In the opposite case, i.e., when the objective function is not maximally-bounded within the solution space, the processor typically instructs the solver to minimize the function.

Since the constraints are derived from the test specification, any valid solution corresponds to a valid test case. Processor 36 creates a test case based on the optimal solution returned by optimization solver 40, at a test case generation step 62. The test case is subsequently applied to DUT 24.

In order to perform high quality verification, it is often advantageous to subject the design to multiple, different test cases. Testing the design under multiple different test cases that are distributed throughout the solution space increases the likelihood of revealing non-compliance events and scenarios. The optimization solver, on the other hand, returns only a single solution in each invocation. Moreover, the optimization process carried out by the solver is deterministic. In other words, the optimization solver will always reach the same optimal solution for a given set of constraints and a given objective function.

In order to cause the optimization solver to reach different solutions, processor 36 modifies the set of constraints and/or the objective function, at a solver input modification step 66. Several alternative methods for modifying the constraint problem are described further below. Having modified the constraints and/or the objective function, the method loops back to optimization step 58 above. Since the optimization solver is provided with a modified set of constraints and/or a modified objective function at each iteration, the returned optimal solutions are likely to be different from one another. As a result, the test cases generated by processor 36 will also differ from one another with high probability.

Some known optimization solvers enable the user to request that the returned solution be different from the solution returned in a previous invocation. Using this option, the solution space can be traversed sequentially by repeatedly invoking the solver. The user may choose to perform a random number of invocations, resulting in a random solution being returned. However, this exhaustive traversal method performs a large and unbounded number of solver iterations for generating each random solution, and is therefore highly inefficient. The solutions generated by this method also tend to be located near the boundary of the solution space. Other known traversal methods involve the use of Markov chains, as are known in the art. These methods are also usually highly inefficient. The methods described herein, on the other hand, produce random solutions using a small and constant number of solver invocations. The methods described herein enable reaching solutions that are located both on the boundary, and deep within the interior of the solution space.

Figure 3:
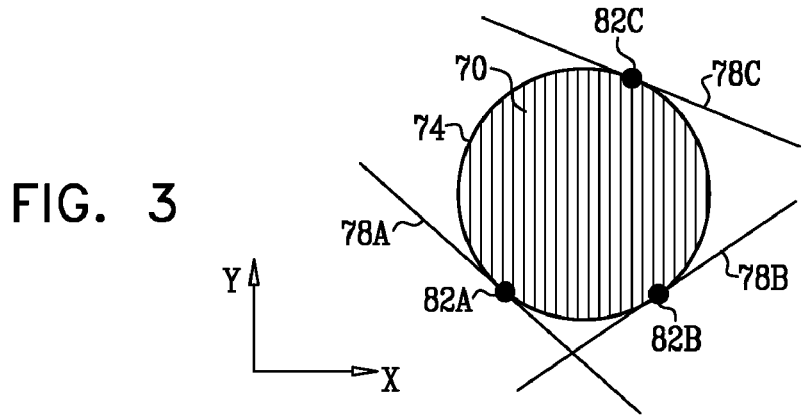
FIG. 3 is a diagram that schematically illustrates a solution space of a constraint problem, in accordance with an embodiment of the present invention.

FIG. 3 is a diagram that schematically illustrates a solution space 70 of a constraint problem, in accordance with an embodiment of the present invention. Each point in solution space 70 (the shaded area in the figure) corresponds to a valid solution of the constraint problem. Points outside space 70 correspond to value assignments that do not satisfy the constraints. The solution space has an outer boundary 74. In the present example, the constraint problem has two variables denoted X and Y, thus the solution space is two-dimensional. Generally, however, the methods described herein can be used with any number of variables, i.e., in solution spaces having any number of dimensions.

Objective functions can be represented as lines or curves in the X-Y plane. For example, linear objective functions correspond to straight lines. Higher order objective functions correspond to curves in the X-Y plane, such as polynomial curves, exponential curves or curves of any other sort. FIG. 3 shows three exemplary linear objective functions denoted 78A . . . 78C. Given a linear objective function of the form aX+bY+c, the task of finding a valid solution that optimizes (maximizes or minimizes) the objective function can be viewed as finding a line of the form aX+bY (i.e., a line having a slope of −a/b) that is tangent to solution space 70. The tangent point, i.e., the point at which the line meets the boundary of the solution space, corresponds to the optimal solution. In FIG. 3, the optimal solutions that optimize functions 78A . . . 78C are denoted 82A . . . 82C, respectively.

In some embodiments of the present invention, processor 36 modifies the objective function (at problem modification step 66 of the method of FIG. 2 above) in a random manner, before invoking the optimization solver. Processor 36 may randomly add one or more of the problem variables, or functions of the variables, to the objective function.

For example, processor 36 may construct an objective function having the form $f=\Sigma k_i \cdot x_i$, wherein $x_i$ denote some or all of the problem variables, and wherein $k_i$ denote coefficients, which are randomly selected from the interval $[-1,1]$. Alternatively, the coefficients can take any desired values, such as by selecting their values at random from any desired range. Further alternatively, the processor may construct or modify the objective function using any other suitable method. In the present example, the processor modifies only the objective function and not the constraints. Alternative methods, in which the set of constraints is also modified, are described further below.

Since in the present example the set of constraints is not modified, the solution space remains the same. In each iteration (each execution of optimization step 58 in the method of FIG. 2 above), the optimization process converges to a different solution, depending on the particular objective function used. Since only the objective function is modified, the optimization process can only reach solutions that are located on the outer boundary of the solution space. In FIG. 3, for example, the three different objective functions 78A . . . 78C cause the solver to converge to three different optimal solutions 82A . . . 82C, all of which are located on boundary 74.

In the present example, solution space 70 is convex. As such, the method described above is capable of reaching any solution on boundary 74. In some cases, however, the solution space may have a non-convex shape. In these cases, the method described above may not be able to reach some sections of the solution space boundary. When the solution space is not convex, the solver may be able to reach a larger part of the boundary by changing the type or order of the objective function (e.g., by using a polynomial function rather than a linear function).

Figure 4:
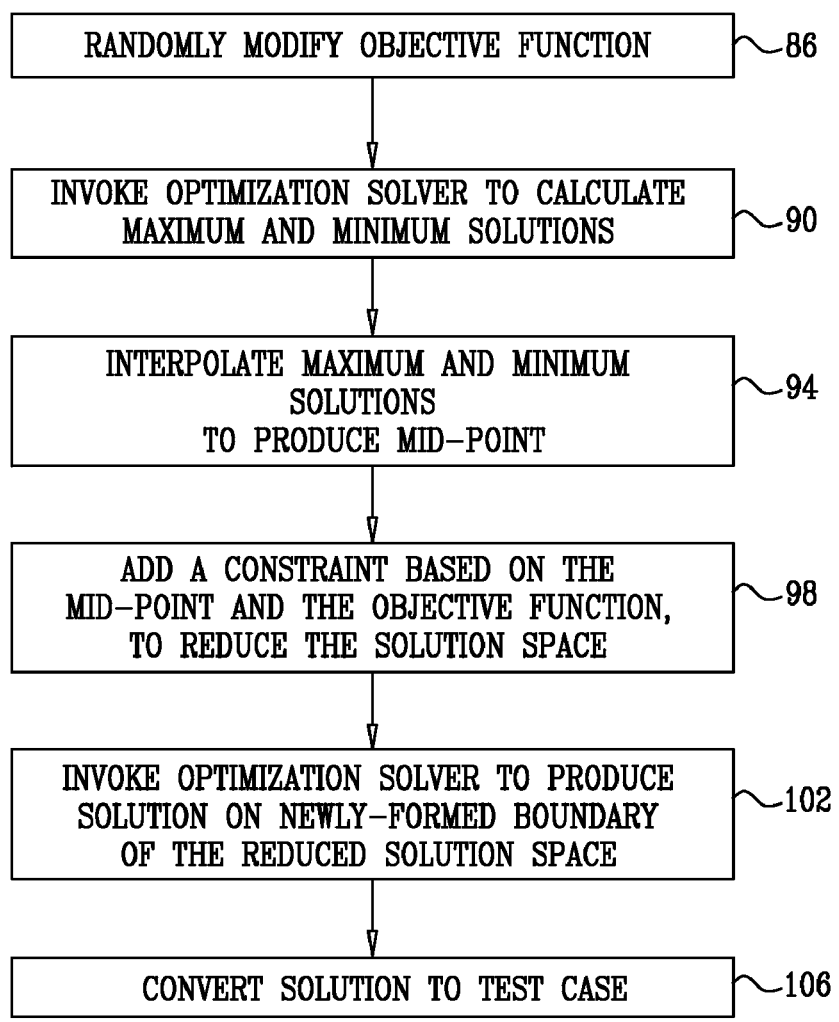
FIG. 4 is a flow chart that schematically illustrates a method for random test generation using an optimization solver, in accordance with another embodiment of the present invention.

FIG. 4 is a flow chart that schematically illustrates an alternative method for random test generation using optimization solver 40, in accordance with another embodiment of the present invention. When generating multiple test cases, the method of FIG. 4 can be used in each iteration of the method of FIG. 2 above, i.e., instead of steps 58-66.

In the method of FIG. 4, processor 36 modifies the original solution space of the problem, so that valid solutions located in the interior of the solution space can also be reached by the optimization solver. Obtaining solutions that are distributed throughout the solution space, i.e., located both on the boundary and in the interior of the solution space, generally improve the diversity and coverage of the generated test cases.

The method of FIG. 4 can be more easily understood with reference to FIGS. 5A-5F below, which schematically illustrate the solution spaces, objective functions and solutions at the different steps of the method of FIG. 4, in accordance with an embodiment of the present invention. The description that follows makes parallel references to FIG. 4 and to FIGS. 5A-5F.

The method begins after the test specification has already been converted by processor 36 to an initial set of constraints and an initial objective function. Processor 36 randomly modifies the objective function, at an objective function modification step 86. As noted above, processor 36 may randomly add one or more of the problem variables, or functions of the variables, to the initial objective function. Alternatively, processor 36 may modify the objective function using any other suitable method.

Figure 5A:
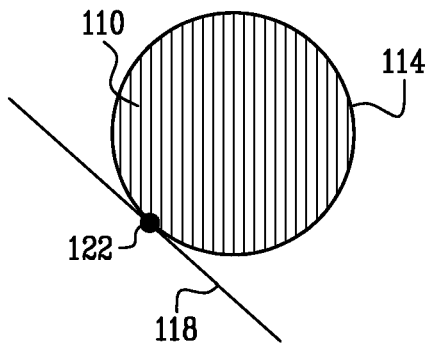
FIGS. 5A-5F are diagrams that schematically illustrate solution spaces in the random test generation method of FIG. 4, in accordance with an embodiment of the present invention.

Processor 36 invokes optimization solver 40 twice, to produce one solution that minimizes the objective function and another solution that maximizes the function, at a first/second invocation step 90. FIG. 5A shows the solution space after the first invocation of solver 40. In FIG. 5A, a solution space 110 represents the collection of all valid solutions to the set of constraints. Solution space 110 has a boundary 114. A line 118 shows the objective function after the first solver invocation. A point 122, at which the objective function is tangent to boundary 114 of solution space 110, represents the solution that minimizes the objective function.

Figure 5B:
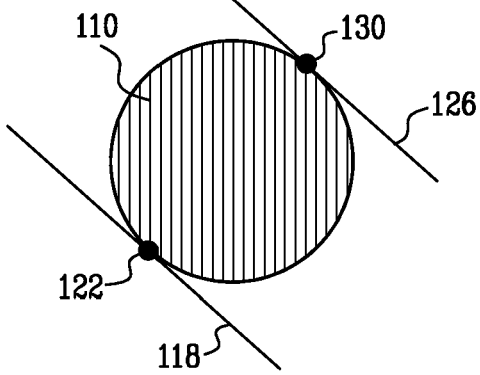

FIG. 5B shows the solution space after the second invocation of solver 40. A line 126, which is parallel with line 118, shows the objective function after the second invocation. A point 130, at which the objective function is also tangent to the boundary of the solution space, represents the solution that maximizes the objective function.

Figure 5C:
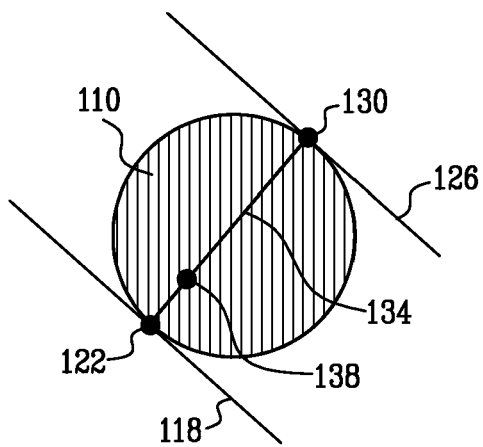

Processor 36 now determines a mid-point, whose location in the X-Y plane is in between minimum solution 122 and maximum solution 130, at an interpolation step 94. In some embodiments, processor 36 randomly selects a location on the line that connects the minimum and maximum solutions. FIG. 5C shows the solution space at this stage. A line 134 connects solutions 122 and 130. A point 138, which has a randomly-selected location along line 134, represents the mid-point. Note that point 138 may not always represent a valid solution to the set of constraints, such as when the solution space is not convex, or when some of the constraints comprise integrality constraints.

Processor 36 now adds a new constraint to the set of constraints, at a constraint addition step 98. The added constraint compares the objective function to the value of the objective function at mid-point 138. In some embodiments, the added constraint has the form $f \leq f(MP)$ or $f \geq f(MP)$, wherein f denotes the objective function and MP denotes the mid-point. The choice whether to use the $\leq$ or the $\geq$ operator is usually random.

Figure 5D:
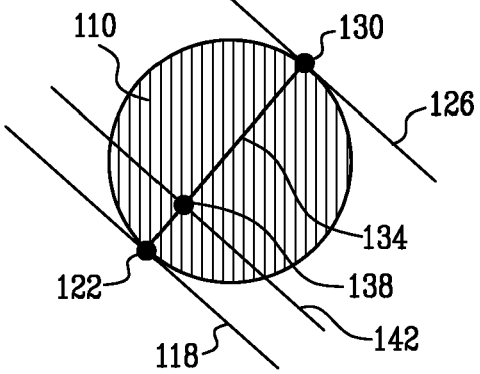
Figure 5E:
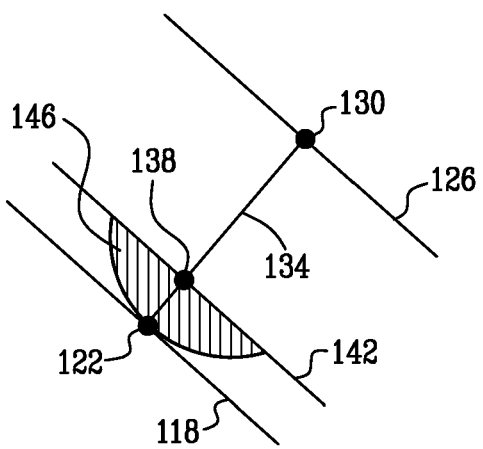

FIGS. 5D and 5E show the solution spaces at this stage. In FIG. 5D, a line 142, which is parallel with lines 118 and 126 and passes through mid-point 138, represents the new constraint. In FIG. 5E, a region 146 shows a reduced solution space, which represents the collection of all valid solutions to the new set of constraints (i.e., the original set plus the newly-added constraint). In the present example, the new constraint is of the form $f \leq f(MP)$, therefore region 146 is located below line 142. If a constraint of the form $f \geq f(MP)$ were added instead, the reduced solution space would contain the part of space 110 that is located above line 142.

Alternatively, the new constraint can compare (using either the $\leq$ or $\geq$ operator) the objective function with a value of the objective function that is selected at random from the interval $[min(x_1,x_2), max(x_1,x_2)]$, wherein $x_1$ and $x_2$ denote the minimum and maximum solutions calculated at step 90 above.

Thus, the newly-added constraint effectively reduces the solution space of the constraint problem. The new constraint and corresponding reduced solution space have the following properties:

The reduced solution space is a sub-space of the original solution space.

At least one valid solution of the original constraint problem is contained in the reduced solution space, i.e., the reduced solution space is non-empty. In the present example, solution 122 is contained in space 146. If the new constraint were to be chosen as $f \geq f(MP)$, solution 130, which is located on the opposite side of original space 110, would be contained in the reduced solution space.

At least one valid solution of the original constraint problem (solution 130 in the present example) is excluded from the reduced solution space. In other words, the reduction of the solution space is a non-trivial reduction.

Figure 5F:
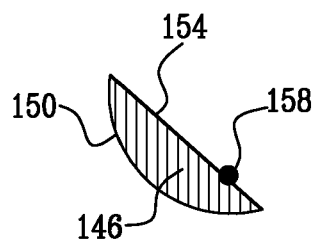

FIG. 5F shows reduced solution space 146. The boundary of the reduced solution space comprises a curve 150, which is part of boundary 114 of original solution space 110, and a line 154, which is a new boundary section defined by the new constraint. In alternative embodiments, processor 36 can add any other suitable constraint or otherwise reduce the solution space, such that the boundary of the reduced solution space is different, at least partially, from the boundary of the original solution space.

Processor 36 now invokes optimization solver 40 again, at a third invocation step 102. The objective function provided to the optimization solver in this invocation is the same function as in step 90 above. The constraint problem provided to the solver, however, comprises the new set of constraints, i.e., the original set plus the newly-added constraint. Thus, the optimization solver attempts to find a solution that optimizes the objective function over the reduced solution space (region 146 in the example of FIG. 5F).

In the third invocation, processor 36 directs optimization solver 40 to find a solution that lies on the new section (line 154) of the solution space boundary. By definition, this solution is located in the interior of original solution space 110. In some embodiments, processor 36 instructs solver 40 to find a solution that minimizes the objective function, if the newly added constraint has the form $f \geq f(MP)$. If, on the other hand, the new constraint has the form $f \leq f(MP)$, processor 36 instructs the optimization solver to maximize the objective function.

In the example of FIG. 5F, a point 158 shows the solution produced by solver 40 in the third invocation. Solution 158 is located on line 154, i.e., on the section of the boundary defined by the newly-added constraint. As can be appreciated, solution 158 is located in the interior of the original solution space of the original constraint problem. Processor 36 creates a test case based on solution 158, at a test generation step 106. The test case is subsequently applied to DUT 24.

Processor 36 may repeat the sequence of steps 86-106 to produce multiple random test cases. At each iteration, the objective function is modified, a constraint is added to the original constraint set, and a random solution, located in the interior of the original solution space, is determined using the new set of constraints. Each iteration involves three invocations of the optimization solver.

The methods of FIGS. 3 and 4 above can be regarded as complementary. The method of FIG. 3 above enables the optimization solver to reach solutions on the boundary of the solution space, while the method of FIG. 4 above provides solutions in the interior of the solution space. The combined use of these two methods may enable the optimization solver cover the entire solution space of the constraint problem.

Although the embodiments described herein mainly address random test case generation for testing hardware designs using an optimization process, the principles of the present invention can also be used for testing software programs, as well as in other applications and domains that involve the calculation of multiple different solutions of a constraint problem.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A computer-implemented method for verifying a design, comprising:
   converting test specifications of the design into a set of constraints defined over variables, such that solutions satisfying the set of constraints define respective valid test cases for verifying the design;
   defining an objective function over at least some of the variables;
   repeatedly invoking an optimization process over an input comprising the set of constraints and the objective function, and randomly modifying the input of each invocation so as to cause the optimization process to produce multiple different solutions that satisfy the set of constraints, and wherein the set of constraints given in the input define a space of valid solutions, and wherein invoking the optimization process comprises producing a solution, which is an extremum of the objective function given in the input within the space of valid solutions, and wherein modifying the input comprises modifying the objective function without modifying the set of constraints, so as to cause the optimization process to produce the multiple different solutions located on a boundary of the space of the valid solutions; and
   generating multiple random test cases for verifying a compliance of the design with the specifications based respectively on the multiple different solutions produced by the optimization process.

2. The method according to claim 1, and comprising subjecting the design to the random test cases, so as to verify the compliance of the design with the specifications.

3. The method according to claim 1, wherein modifying the objective function comprises randomly adding a function of one or more of the variables to the objective function.

4. The method according to claim 1, wherein modifying the input comprises modifying the set of constraints such that a modified space of solutions that satisfy the modified set of constraints is a non-trivial and non-empty subspace of the space of the valid solutions.

5. The method according to claim 4, wherein modifying the set of constraints comprises adding a constraint to the set of constraints.

6. The method according to claim 5, wherein adding the constraint comprises defining the added constraint by:
   invoking the optimization process to produce first and second solutions that respectively minimize and maximize the objective function;
   selecting intermediate values of the at least some of the variables between respective values of the at least some of the variables at the first and second solutions; and
   formulating the added constraint to compare the objective function to a the objective function evaluated at the intermediate values.

7. The method according to claim 4, wherein invoking the optimization process comprises producing a solution located in an interior of the space of the valid solutions by directing the optimization process to produce the solution located on a boundary of the modified space of solutions but not on the boundary of the space of the valid solutions.

8. The method according to claim 7, wherein directing the optimization process comprises instructing the optimization process to perform one of minimizing and maximizing the objective function over the modified space of solutions.

9. Apparatus for verifying a design, comprising:
   an interface, which is arranged to accept test specifications of the design and to output multiple random test cases for verifying a compliance of the design with the specifications; and
   a processor, which is arranged to convert the specifications into a set of constraints defined over variables such that solutions satisfying the set of constraints define respective valid test cases for verifying the design, to define an objective function over at least some of the variables, to repeatedly invoke an optimization process over an input comprising the set of constraints and the objective function, to randomly modify the input of each invocation so as to cause the optimization process to produce multiple different solutions that satisfy the set of constraints wherein the set of constraints given in the input define a space of valid solutions, and wherein the optimization process produces a solution, which is an extremum of the objective function given in the input within the space of valid solutions, and wherein the processor is arranged to modify the objective function without modifying the set of constraints, so as to cause the optimization process to produce the multiple different solutions located on a boundary of the space of the valid solutions, and to generate the multiple random test cases based respectively on the multiple different solutions produced by the optimization process.

10. The apparatus according to claim 9, wherein the processor is arranged to modify the objective function by randomly adding a function of one or more of the variables to the objective function.

11. The apparatus according to claim 9, wherein the processor is arranged to modify the input by modifying the set of constraints, such that a modified space of solutions that satisfy the modified set of constraints is a non-trivial and non-empty subspace of the space of the valid solutions.

12. The apparatus according to claim 11, wherein the processor is arranged to modify the set of constraints by adding a constraint to the set of constraints.

13. The apparatus according to claim 12, wherein the processor is arranged to define the added constraint by:
   invoking the optimization process to produce first and second solutions that respectively minimize and maximize the objective function;
   selecting intermediate values of the at least some of the variables between respective values of the at least some of the variables at the first and second solutions; and
   formulating the added constraint to compare the objective function to a the objective function evaluated at the intermediate values.

14. The apparatus according to claim 11, wherein the processor is arranged to produce a solution located in an interior of the space of the valid solutions by directing the optimization process to produce the solution located on a boundary of the modified space of solutions but not on the boundary of the space of the valid solutions.

15. The apparatus according to claim 14, wherein the processor is arranged to direct the optimization process by instructing the optimization process to perform one of minimizing and maximizing the objective function over the modified space of solutions.

16. A computer software product for verifying a design, the product comprising a computer-readable medium, in which program instructions are stored, which instructions, when read by a computer, cause the computer to accept test specifications of the design, to convert the specifications into a set of constraints defined over variables such that solutions satisfying the set of constraints define respective valid test cases for verifying the design, to define an objective function over at least some of the variables, to repeatedly invoke an optimization process over an input comprising the set of constraints and the objective function, to randomly modify the input of each invocation so as to cause the optimization process to produce multiple different solutions that satisfy the set of constraints, wherein the set of constraints given in the input define a space of valid solutions, and wherein invoke the optimization process comprises producing a solution, which is an extremum of the objective function given in the input within the space of valid solutions, and wherein modify the input comprises modify the objective function without modify the set of constraints, so as to cause the optimization process to produce the multiple different solutions located on a boundary of the space of the valid solutions, and to, generate multiple random test cases for verifying a compliance of the design with the specifications based respectively on the multiple different solutions produced by the optimization process.

* * * * *